US006686276B2

(12) United States Patent
Edrei et al.

(10) Patent No.: US 6,686,276 B2
(45) Date of Patent: Feb. 3, 2004

(54) SEMICONDUCTOR CHIP HAVING BOTH POLYCIDE AND SALICIDE GATES AND METHODS FOR MAKING SAME

(75) Inventors: Itzhak Edrei, Migdal Haemek (IL); Efraim Aloni, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 10/226,487

(22) Filed: Aug. 22, 2002

(65) Prior Publication Data
US 2003/0001220 A1 Jan. 2, 2003

Related U.S. Application Data

(62) Division of application No. 09/522,246, filed on Mar. 9, 2000.

(51) Int. Cl.[7] .............................................. H01L 21/44
(52) U.S. Cl. ....................... 438/655; 438/649; 438/651; 438/682; 438/683
(58) Field of Search ................................ 438/275, 197, 438/199, 649, 651, 655, 682, 683

(56) References Cited

U.S. PATENT DOCUMENTS

| 5,219,775 | A | | 6/1993 | Saeki et al. | |
| 5,610,420 | A | | 3/1997 | Kuroda et al. | |
| 5,768,192 | A | | 6/1998 | Eitan | |
| 5,869,396 | A | | 2/1999 | Pan et al. | |
| 5,966,603 | A | | 10/1999 | Eitan | |
| 6,037,625 | A | | 3/2000 | Matsubara et al. | |
| 6,087,225 | A | * | 7/2000 | Bronner et al. | 438/275 |
| 6,103,611 | A | | 8/2000 | En et al. | |
| 6,146,994 | A | | 11/2000 | Hwang | |
| 6,162,675 | A | | 12/2000 | Hwang et al. | |
| 6,162,677 | A | * | 12/2000 | Miyakawa et al. | 438/672 |
| 6,174,758 | B1 | * | 1/2001 | Nachumovsky | 438/199 |
| 6,177,319 | B1 | | 1/2001 | Chen | |
| 6,194,258 | B1 | | 2/2001 | Wuu | |
| 6,207,492 | B1 | | 3/2001 | Tzeng et al. | |
| 6,207,543 | B1 | | 3/2001 | Harvey et al. | |
| 6,225,155 | B1 | | 5/2001 | Lin et al. | |
| 6,242,311 | B1 | | 6/2001 | Ahn et al. | |
| 6,265,739 | B1 | | 7/2001 | Yaegashi et al. | |
| 6,271,087 | B1 | | 8/2001 | Kinoshita et al. | |
| 6,432,776 | B1 | * | 8/2002 | Ono | 438/275 |
| 6,458,702 | B1 | * | 10/2002 | Aloni | 438/655 |

* cited by examiner

Primary Examiner—Kevin M. Picardat
(74) Attorney, Agent, or Firm—Bever, Hoffman & Harms, LLP; E. Eric Hoffman

(57) ABSTRACT

A semiconductor process is provided that creates transistors having polycide gates in a first region of a semiconductor substrate and transistors having salicide gates in a second region of the semiconductor substrate. A polysilicon layer having a first portion in the first region and a second portion in the second region is formed over the semiconductor substrate. Then, a first dielectric layer is formed over the second portion of the polysilicon layer. Metal silicide is deposited over first portion of the polysilicon layer and the first dielectric layer. The metal silicide overlying the first dielectric layer is removed as is the first dielectric layer. The metal silicide and the polysilicon layer are etched to form polycide gates in the first region and polysilicon gates in the second region. A second dielectric layer is formed over the first region. Refractory metal is then deposited over the resulting structure and reacted. As a result, salicide is formed on the polysilicon gates of the second region.

7 Claims, 9 Drawing Sheets

SEMICONDUCTOR CHIP HAVING BOTH POLYCIDE AND SALICIDE GATES AND METHODS FOR MAKING SAME

CROSS-REFERENCE TO RELATED APPLICATIONS

This application is a divisional of application Ser. No. 09/522,246 filed Mar. 9, 2000 entitled "SEMICONDUCTOR CHIP HAVING BOTH POLYCIDE AND SALICIDE GATES AND METHODS FOR MAKING SAME", by Itzhak Edrei, et al.

This application relates to co-pending application Ser. No. 09/522,245 filed Mar. 9, 2000 entitled "METHODS FOR MAKING SEMICONDUCTOR CHIP HAVING BOTH SELF ALIGNED SILICIDE REGIONS AND NON-SELF ALIGNED SILICIDE REGIONS", by Efraim Aloni, owned by the assignee of this application and incorporated herein by reference.

This application also relates to U.S. Pat. No. 6,174,758 issued Jan. 16, 2001, entitled "SEMICONDUCTOR CHIP HAVING FIELDLESS ARRAY WITH SALICIDE GATES AND METHOD FOR MAKING SAME" by Nachumovsky, et al., owned by the assignee of this application and incorporated herein by reference.

FIELD OF THE INVENTION

The present invention relates to the fabrication of gate electrodes of a semiconductor device. More specifically, the present invention relates to the fabrication of transistors having polycide and salicide gate electrodes on the same semiconductor chip.

BACKGROUND OF THE INVENTION

FIG. 1 is a cross sectional view of a conventional n-channel field effect transistor 100. Transistor 100, which is formed in semiconductor substrate 101, includes n+ type source and drain regions 102 and 103, p-type channel region 104, gate oxide layer 105, conductively doped polycrystalline silicon (polysilicon) layer 106 and tungsten silicide (WSi) layer 107. Together, polysilicon layer 106 and tungsten silicide layer 107 form a gate electrode 108. The combined polysilicontungsten silicide structure is commonly referred to as polycide. Polycide is typically formed by depositing a blanket layer of polysilicon, and then depositing a layer of refractory metal silicide, such as tungsten silicide, over the polysilicon layer. The resulting structure is then annealed and etched to form the desired conductive elements (e.g., gate electrodes).

FIG. 2 is a cross sectional view of a conventional n-channel field effect transistor 200. Transistor 200, which is formed in semiconductor substrate 201, includes n+ type source and drain regions 202 and 203, p-type channel region 204, gate oxide layer 205, polysilicon layer 206 and titanium silicide (TiSi) layers 207S, 207G, and 207D. Together, polysilicon layer 206 and titanium silicide layer 207G form a gate electrode 208. The combined polysilicon/titanium silicide structure is commonly referred to as salicide. Note that titanium silicide layers 207S and 207D are located over source and drain regions 202 and 203, respectively. Titanium silicide layers 207S and 207D reduce the contact resistance to source and drain regions 202 and 203 respectively. The salicide layers are typically formed by exposing the upper surfaces of source region 202, drain region 203, and polysilicon layer 206. A layer of titanium is then blanket deposited over the resulting structure. A heat treatment is then performed, causing the titanium to react with the underlying regions of polysilicon and silicon (i.e., source region 202, drain region 203 and polysilicon layer 206), thereby forming titanium silicide layers 207S, 207G, and 207D. As a result, the silicide layers 207S, 207G, and 207D are self-aligned with the underlying silicon regions. Self-aligned silicide layers are usually referred to as salicide layers. Thus, titanium silicide layers 207S, 207G, and 207D, are usually referred to as titanium salicide layers.

The processing requirements of polycide and salicide gate electrodes are inconsistent with one another. As a result, these two types of gate electrodes are not typically used on the same chip. Moreover, there has been no motivation to use both types of gate electrodes on the same chip. However, it may become desirable to have methods for forming both polycide and salicide gate electrodes on the same chip.

SUMMARY OF THE INVENTION

Accordingly, the present invention provides efficient processes for fabricating transistors having polycide gates and transistors having salicide gates on the same wafer. Specifically, in accordance with one embodiment of the present invention, a gate oxide layer or multiple gate oxide layers are formed on a semiconductor substrate. Then, a polysilicon layer having a first portion and a second portion is deposited over the gate oxide layer. A first dielectric layer is formed on the second portion of the polysilicon layer. A metal silicide layer is deposited over the first portion of the polysilicon layer and the first dielectric layer. The portion of the metal silicide layer over the first dielectric is removed. Then, the first dielectric layer is also removed. The metal silicide layer and the polysilicon layer are etched to form one or more polycide gate electrodes and one or more polysilicon gates.

Source and drain regions for the transistors are formed using conventional techniques. Then a second dielectric layer is formed over the polycide gate electrodes and the source and drain regions of the polycide gate transistors. A metal layer is deposited over the resulting structure. The metal layer is reacted to form salicide layers with silicon in contact with the metal layer. Specifically, salicide layers are formed over the polysilicon gates and the source and drain regions of the salicide gate transistors.

The above-described process steps advantageously enable transistors having polycide gates and transistors having salicide gates to be fabricated on the same semiconductor device. The present invention will be more fully understood in view of the following description and drawings.

DETAILED DESCRIPTION

As semiconductor processes improve (i.e., use a smaller minimum line size) it becomes desirable to fabricate integrated circuits having devices from different technology sources and processes. For example, a system on a chip may include devices fabricated using a 0.5 micron process with devices using a 0.35 micron process. However, processing requirements may not be identical for the two processes. For example, a 0.5 micron process typically uses polycide gate structures, while a 0.35 micron process typically requires salicide gate structures.

The different methods used to form polycide gate structures and salicide gate structures may cause problems. For example, titanium may be deposited in undesirable locations in a field-less array region, thereby resulting in a short.

However, it may be desirable to maintain certain regions with polycide and certain regions with salicide. For example, it may be desirable to fabricate logic region with salicide to improve speed (lower contact resistance), while it may be desirable to fabricate the a field-less array region with polycide if the field-less array region is an optical sensor that should not have reflective surfaces as would be caused by some refractory metal silicide such as titanium silicide.

Thus, the present invention provides a method to conveniently fabricate semiconductor devices having transistors having salicide gates and transistors having polycide gates. Specifically, FIGS. 3–26 illustrate a method in accordance with one embodiment of the present invention.

Figure 1:
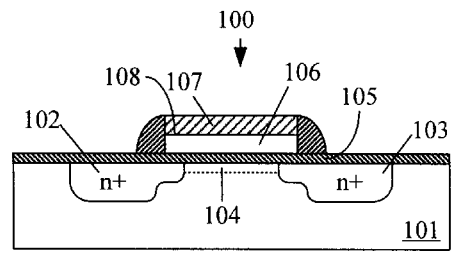
FIG. 1 is a cross sectional view of a conventional transistor having a polycide gate.
Figure 2:
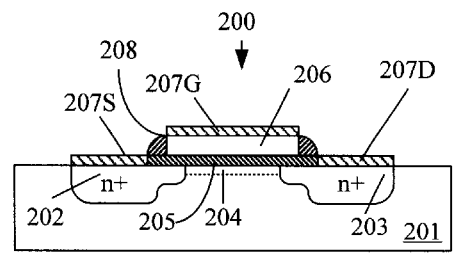
FIG. 2 is a cross sectional view of a conventional transistor having a salicide gate.
Figure 3:
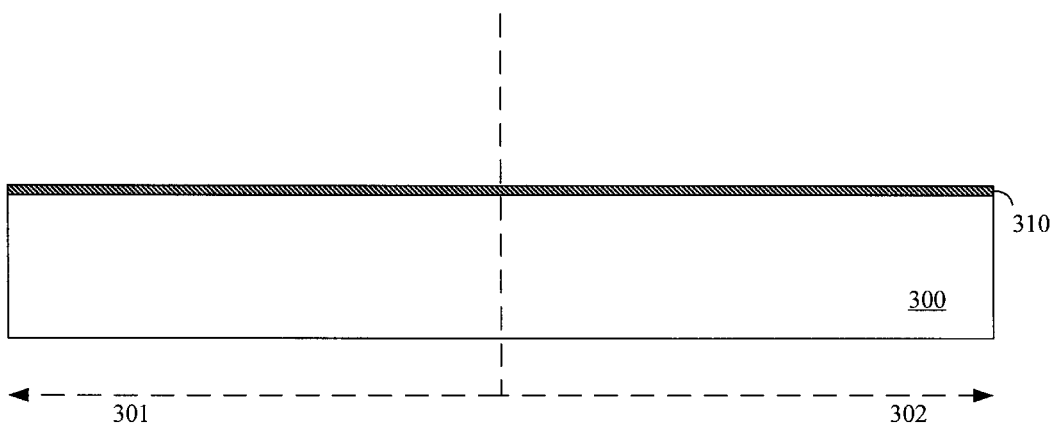
FIGS. 3–26 are cross sectional views of the formation of a semiconductor device having a transistor with a polycide gate and a transistor with a salicide gate in accordance with one embodiment of the present invention.
Figure 4:
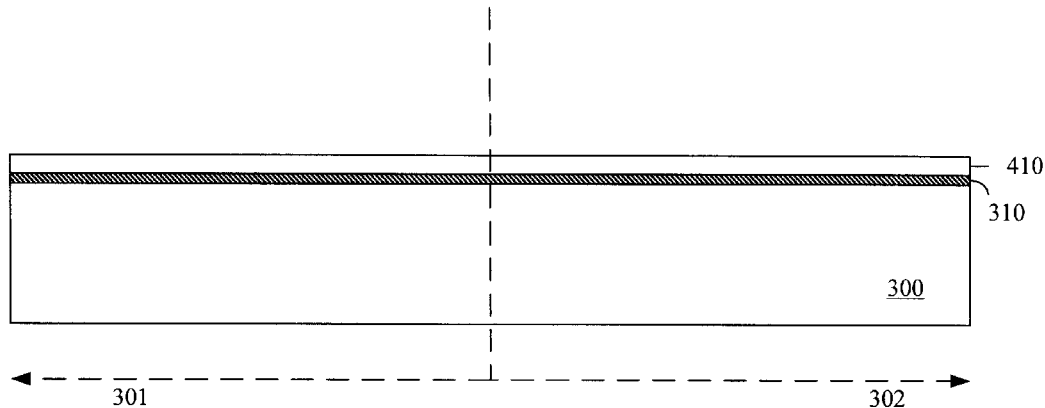

As shown in FIG. 3, a semiconductor substrate 300 is divided into a first region 301 and a second region 302. First region 301 represents portions of semiconductor substrate 300 to be used for transistors having polycide gate structures. Second region 302 represents portions of semiconductor substrate to be used for transistors having salicide gate structures. However in some embodiments of the present invention transistors have salicide gates are interspersed with transistors having polycide gates. Although not shown, the upper surface of semiconductor substrate 300 may contain field oxide to isolate different devices. A thin dielectric layer 310 is formed on the upper surface of semiconductor substrate 300 to a thickness in the range of 50 to 140 Å. In the described embodiment, dielectric layer 310 is a gate oxide layer formed to a thickness of about 70 Å. Some embodiments of the present invention may include additional thin dielectric layers (not shown) on portions of semiconductor substrate 300. For example, a second thin dielectric layer provides thicker gate oxides for certain transistors. The combined thickness of thin dielectric layer 310 and the second thin dielectric layer is typically in the range of 50–300 Å. Then, as shown in FIG. 4, a polysilicon layer 410 is deposited over gate oxide layer 310 to a thickness in the range of 1000–3000 Å. In the described embodiment, polysilicon layer 410 has a thickness of about 2500 Å. Typically, polysilicon layer 410 is deposited using a low temperature process which forms amorphous silicon. For conciseness, the term "polysilicon," as used herein, encompasses amorphous silicon.

Figure 5:
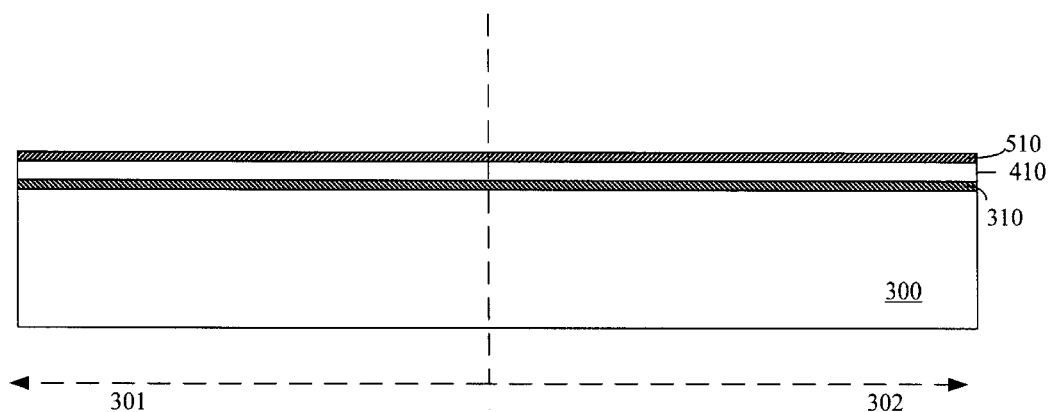
Figure 6:
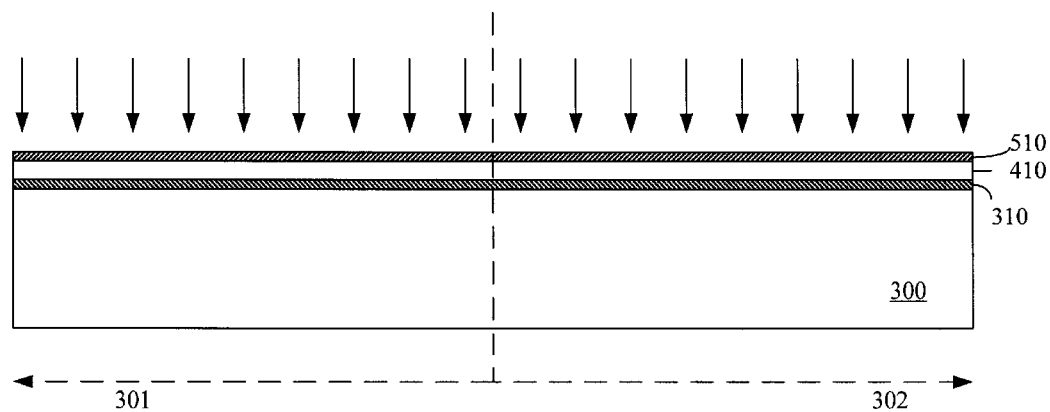
Figure 7:
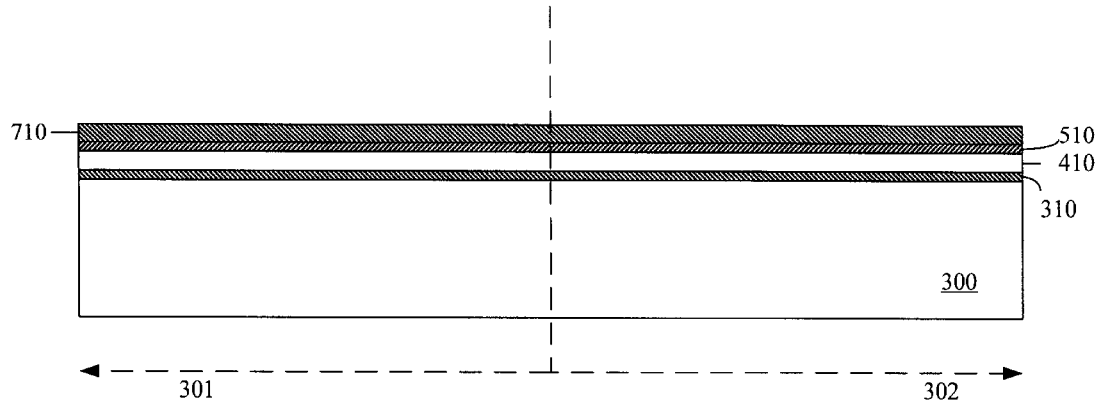
Figure 8:
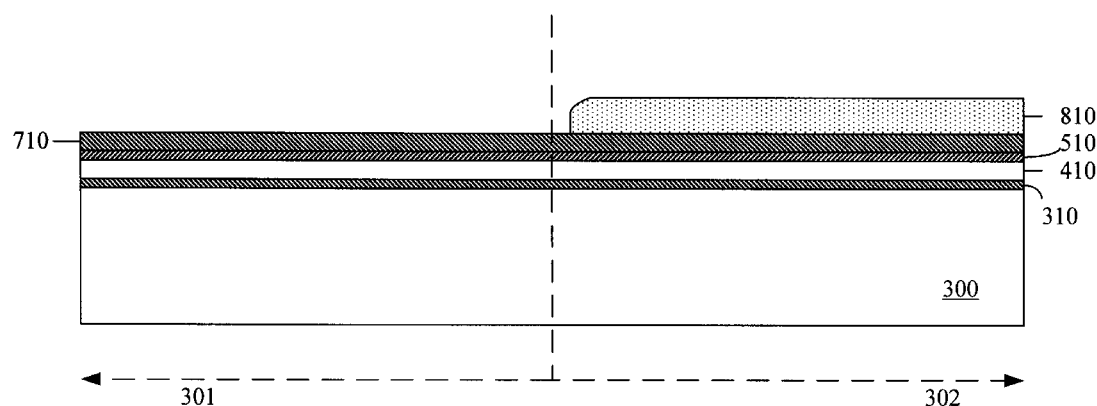

Then as shown in FIG. 5, a thin dielectric layer 510 is deposited over polysilicon layer 410 to a thickness in the range of 50–500 Å. In the described embodiment thin dielectric layer 510 is a TEOS oxide layer having a thickness of about 200 Å. Then, as shown in FIG. 6., ion dopants, such as Arsenic, phosphor, or Boron, are implanted through thin dielectric layer 510 into polysilicon layer 410. In the described embodiment, phosphor ions are implanted at a density of 2E14 ions/cm² with an implantation energy of 40 KeV. After ion implantation, a thick dielectric layer 710 having a thickness in the range of 500–2500 Å is deposited over thin dielectric layer 610. In the described embodiment, thick dielectric layer 710 is a TEOS oxide layer having a thickness of about 1800 Å. In some embodiments, semiconductor substrate 300 is annealed in a furnace at a temperature of 600–1000 degrees C.

Figure 9:
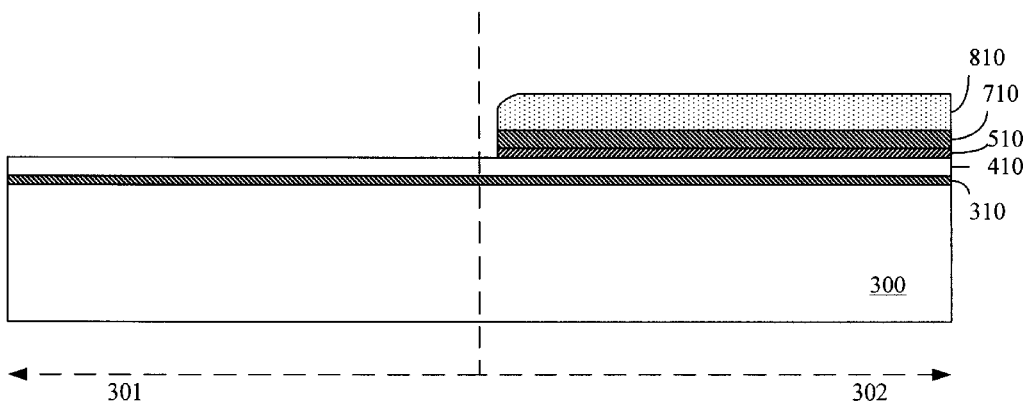
Figure 10:
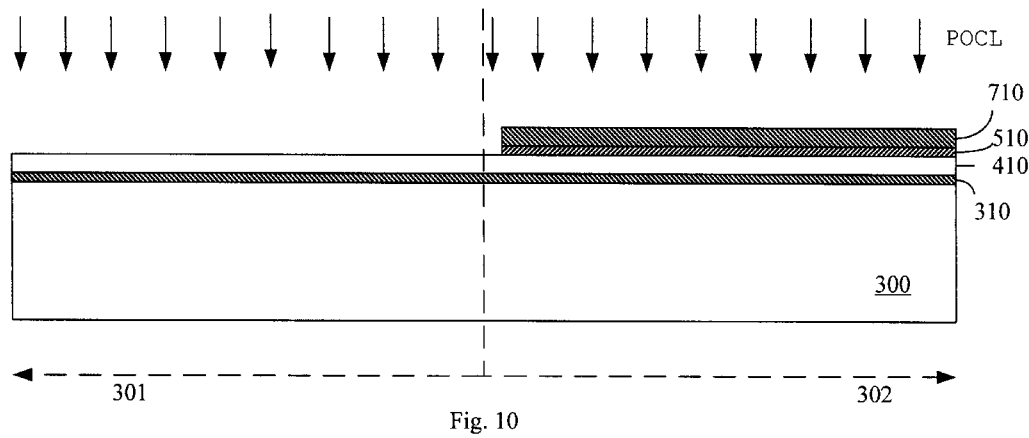
Figure 11:
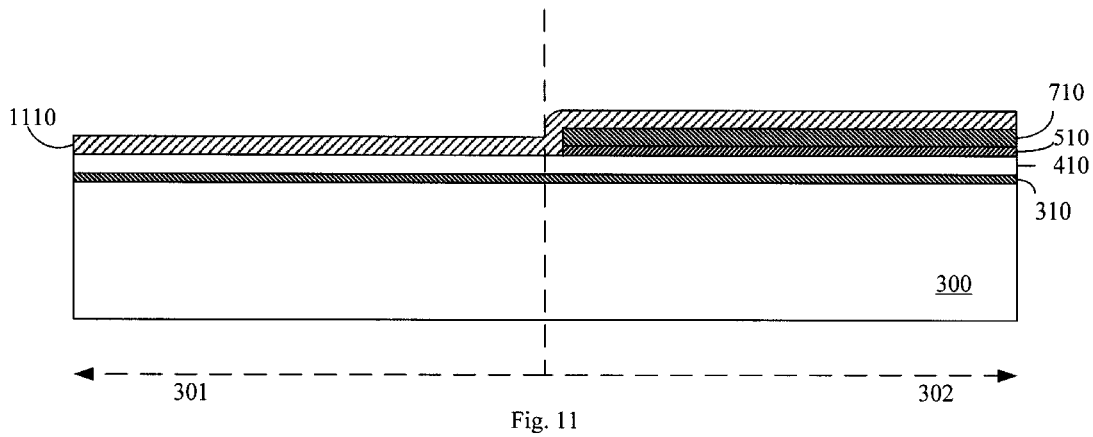
Figure 12:
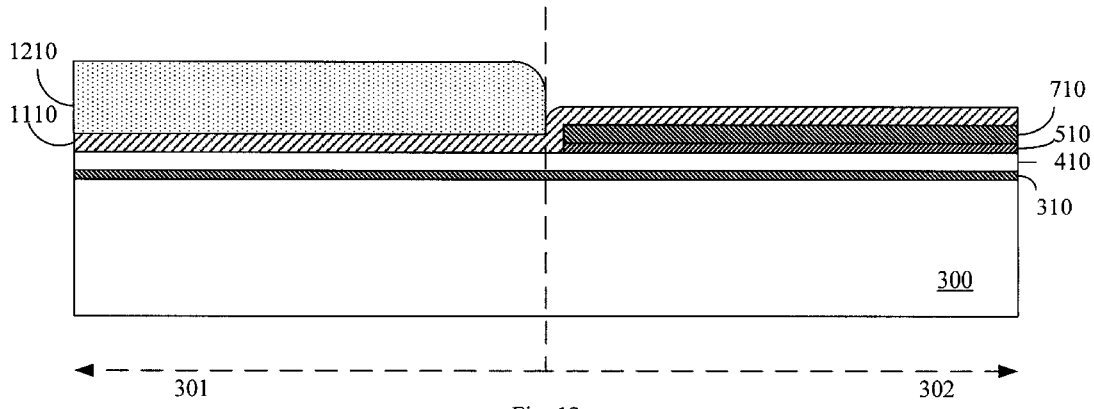

A layer of photoresist is then spun over the upper surface of semiconductor substrate 300. The photoresist layer is exposed and developed to create a photoresist mask 810 (FIG. 8), which covers second region 302. Semiconductor substrate 300 is then etched to remove any exposed dielectric. In the described embodiment, semiconductor substrate is etched using a BOE (Buffered oxide etch) at 24 degrees C. for 1–2 minutes. Thus as shown in FIG. 9, the portions of thin dielectric layer 510 and thick dielectric layer 710 not covered by photoresist mask 810 are removed in the etching process. Therefore, polysilicon layer 410 in first region 301 is exposed. Photoresist mask 810 is removed using conventional techniques. Then, as shown in FIG. 10, semiconductor substrate 300 is baked in a furnace with POCL to further dope the exposed portions of polysilicon layer 410. The portion of polysilicon layer 410 covered by thin dielectric layer 510 and thick dielectric layer 710 is not further doped. An oxide etch is used to remove any oxide that might have formed over the exposed portion of polysilicon layer 410. The oxide etch may remove portions of thick dielectric layer 710. However, the combined thickness of thin dielectric layer 310 and thick dielectric layer 710 should be in the range of 100–1500 Å.

Figure 13:
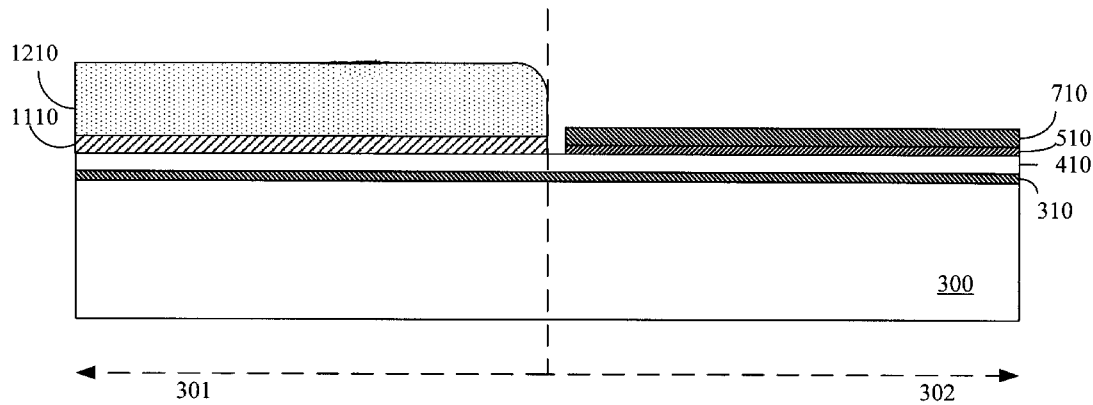
Figure 14:
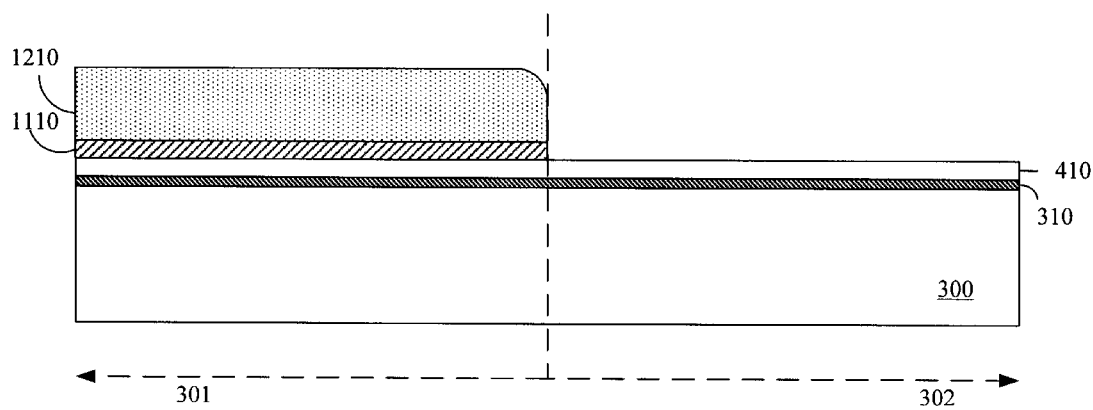
Figure 15:
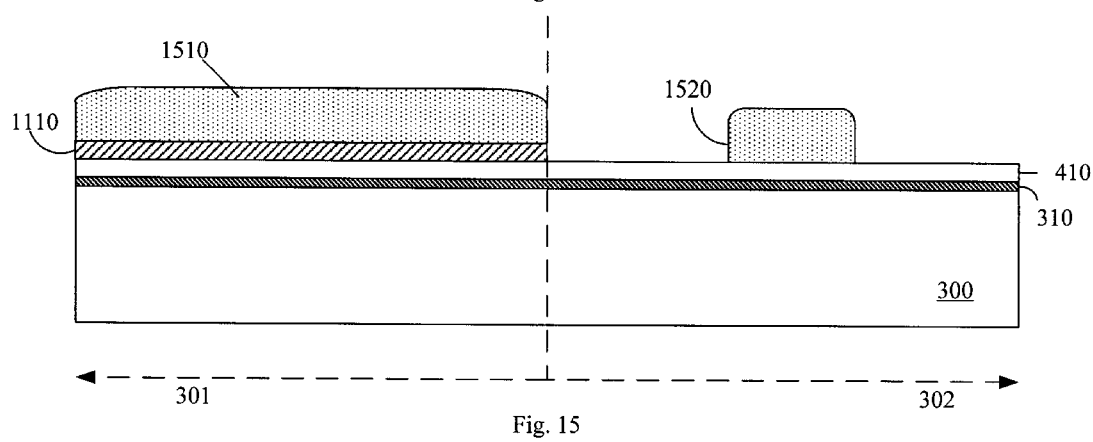

After the oxide etch, a refractory metal silicide layer 1110 (FIG. 11) is deposited over the upper surface of semiconductor substrate 300 to a thickness in the range of of 200–3000 Å. In the described embodiment, refractory metal silicide layer is a tungsten silicide (WSi) layer having a thickness of 1500 Å. A layer of photoresist is then spun over the upper surface of semiconductor substrate 300. This photoresist layer is exposed and developed to create a photoresist mask 1210 (FIG. 12), which covers first region 301. As shown in FIG. 13, a conventional silicide etching step using HBr and SF6 gas is performed on semiconductor substrate 300 to removed the exposed portions of refractory metal silicide layer 1110. Then, as shown in FIG. 14, a conventional dielectric etching process is used to remove the remaining portions of thin dielectric layer 310 and thick dielectric layer 710. Then, photoresist mask 1210 is removed conventionally.

Figure 16:
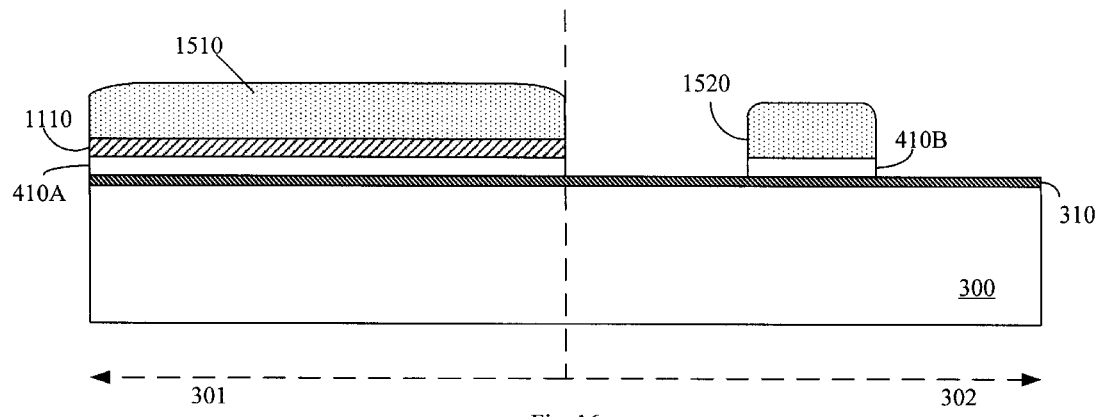
Figure 17:
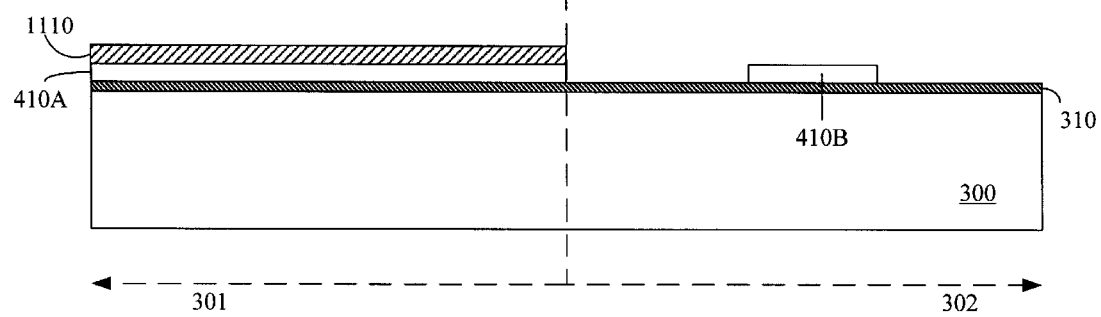
Figure 18:
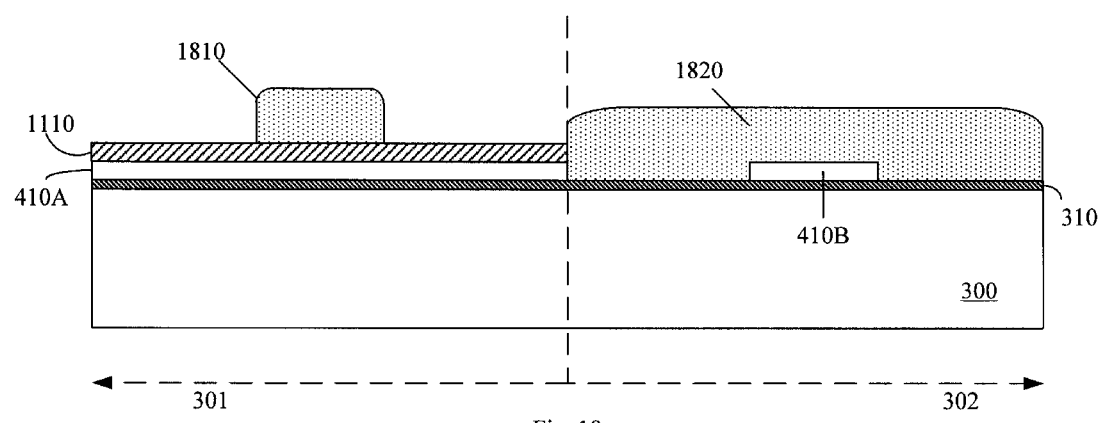

A layer of photoresist is then spun over the upper surface of semiconductor substrate 300. This photoresist layer is exposed and developed to create a photoresist mask 1510 (FIG. 15) and a photoresist mask 1520. Photoresist mask 1510 covers first region 301. Photoresist mask 1520 defines a gate structure for a second transistor in second region 302. A conventional silicon etching process is used to remove the portions polysilicon layer 410 not covered by photoresist mask 1520. Thus, as shown in FIG. 16, polysilicon layer 410 is reduced to polysilicon layer 410A and polysilicon gate 410B. As shown in FIG. 17, photoresist masks 1510 and 1520 are removed using conventional techniques.

Figure 19:
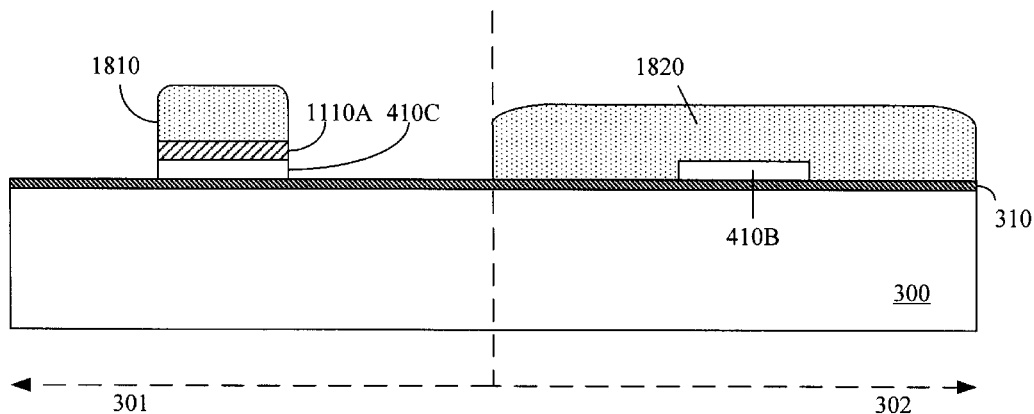
Figure 20:
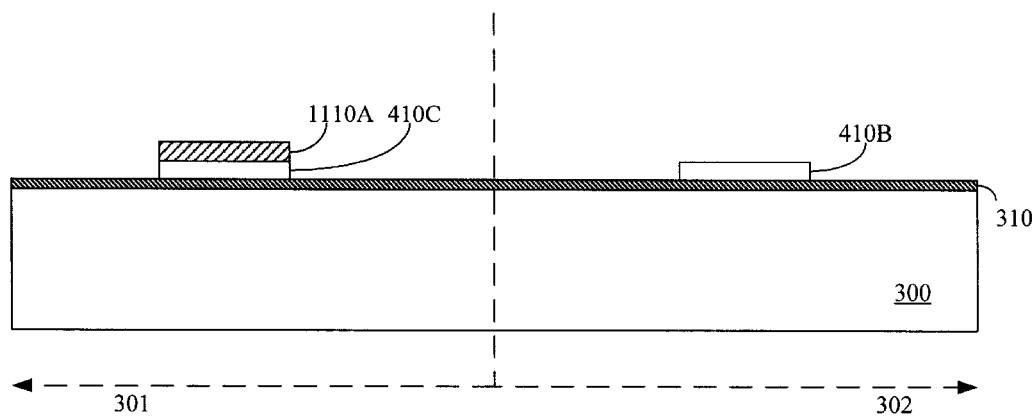

A layer of photoresist is then spun over the upper surface of semiconductor substrate 300. This photoresist layer is exposed and developed to create a photoresist mask 1810 (FIG. 18) and a photoresist mask 1820. Photoresist mask 1810 defines a gate structure for a first transistor in first region 301. Photoresist mask 1820 covers second region 302. A conventional silicon etching process is used to remove portions of refractory metal silicide layer 1110 and polysilicon layer 410A not covered by photoresist mask 1810. Thus, as shown in FIG. 19, refractory metal silicide layer 1110 is reduced to a refractory metal silicide layer 1110A and polysilicon layer 410A is reduced to a polysilicon gate 410C. Together, refractory metal silicide layer 1110A and polysilicon gate 410C forms a polycide gate electrode for a transistor being formed in first region 301. As shown in FIG. 20, photoresist masks 1810 and 1820 are removed using conventional techniques. The order of forming polysilicon gates 410C and 410B may be reversed. In some embodiments a single photoresist layer is exposed and developed to form photoresist masks 1810 and 1520. Then a single silicon etching step is used to form refractory metal silicide layer 1110, polysilicon gate 410C and polysilicon layer 410B. Furthermore, in some embodiments, semiconductor substrate 300 is annealed at a temperature in the range of 700–1000 degrees C. to bond refractory metal silicide layer 1110A to polysilicon gate 410C.

Figure 21:
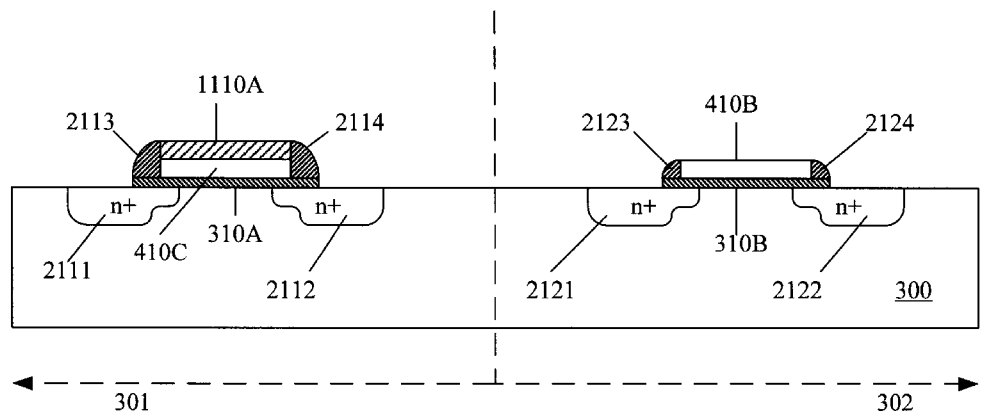
Figure 22:
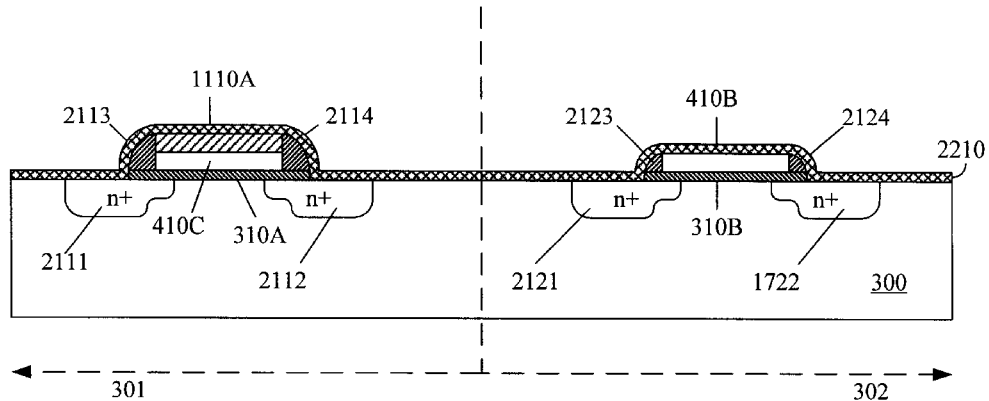

Then, as shown in FIG. 21, conventional techniques (e.g. lightly doped implants and oxide spacer formation followed by heavy source and drain implants) are used to form oxide spacers 2113 and 2114 adjacent to polysilicon gate 410C, oxide spacers 2123 and 2124 adjacent to polysilicon gate 410B, source and drain regions 2111 and 2112 in first region 301, and source and drain regions 2121 and 2122 in second region 302. In some embodiments of the present invention, buried bitlines are used instead of standard source and drain regions in first region 301. In these embodiments, the buried bitlines are typically formed prior to depositing gate oxide layer 310 (FIG. 4).

Figure 23:
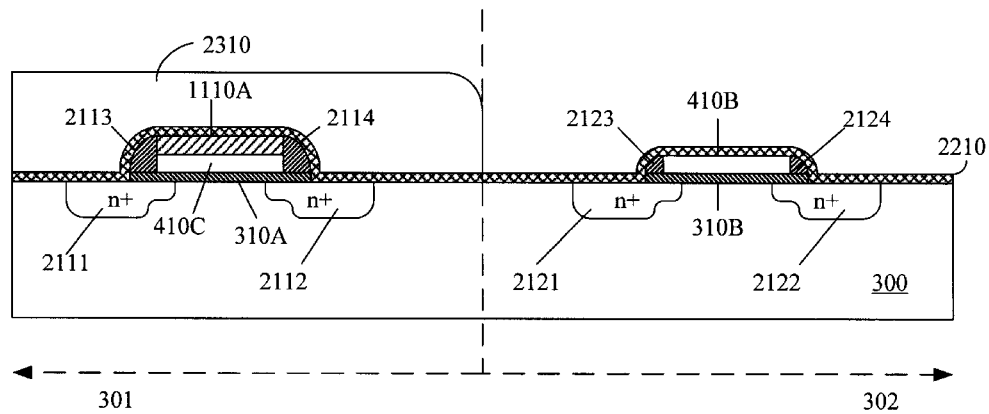
Figure 24:
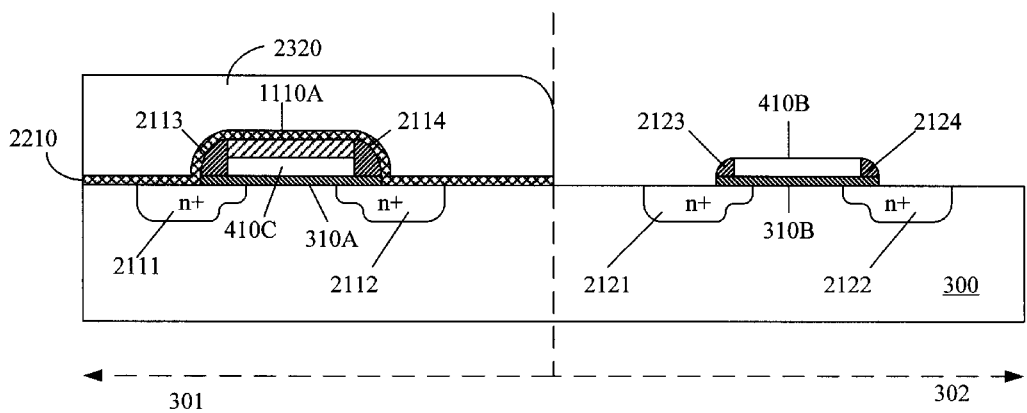
Figure 25:
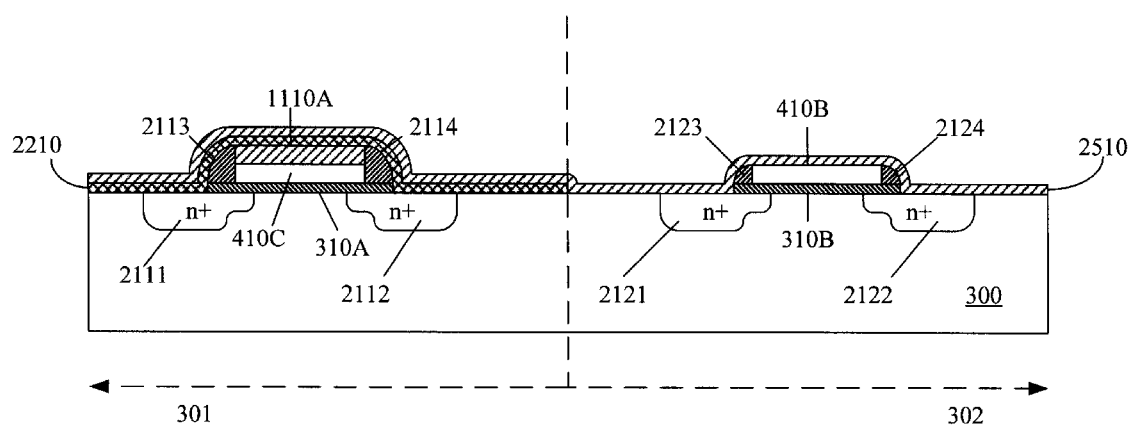

A thin dielectric layer 2210 (FIG. 22) is then deposited over the upper surface of semiconductor substrate 300 to a thickness in the range of 100–500 Å. In some embodiments, multiple dielectric layers may be used in place of dielectric layer 2210. For example, in some embodiment, thin dielectric layer 2210 is replaced by an oxide layer deposited to a thickness of 200 Å, followed by a nitride layer deposited to a thickness of 200 Å. A layer of photoresist is then spun over the upper surface of semiconductor substrate 300. This photoresist layer is exposed and developed to create a photoresist mask 2310 (FIG. 23). Photoresist mask 2310 protects the portion of thin dielectric layer 2210 in first region 301. A conventional dielectric etch is used to remove the exposed portion of dielectric layer 2210 as shown in FIG. 24. Then, any remaining photoresist is removed using conventional processes.

After etching thin dielectric layer 2210, a refractory metal layer 2510 (FIG. 25) is deposited over the upper surface of semiconductor substrate 300 to a thickness in the range of 100–700 Å. In the described embodiment, refractory metal layer is a titanium layer having a thickness of 550 Å. A first anneal is then performed to form metal salicide at those locations where refractory metal layer 2510 overlies silicon. Although not shown, the upper surface of second region 302 not used for source and drain regions is typically covered by field oxide. The portions of refractory metal layer 2510 which overlie the field oxide (not shown), thin dielectric layer 2210, and oxide spacers 2113 and 2114, do not react with these regions and therefore, remain refractory metal.

Figure 26:
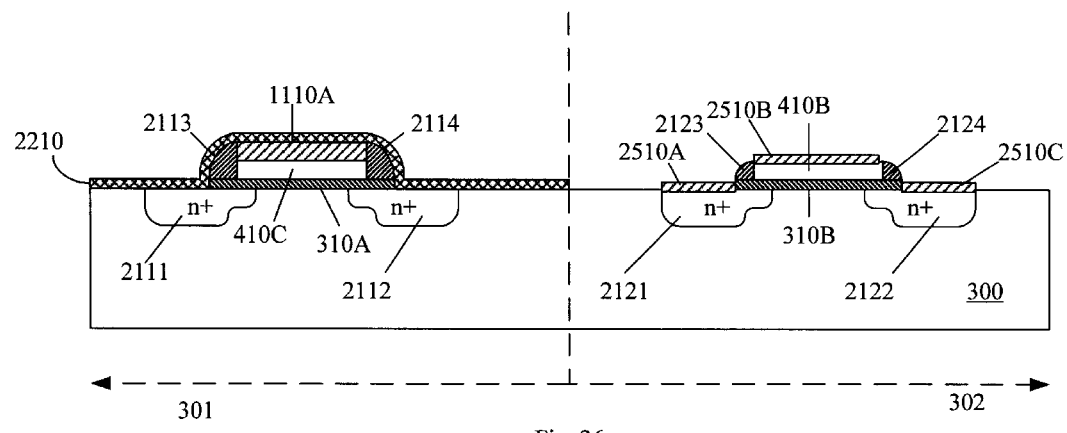

In FIG. 26, a refractory metal etching step removes the unreacted portions of refractory metal layer 2510 leaving salicide layer 2510A overlying source region 2121, salicide layer 2510B overlying polysilicon gate 410B, and salicide layer 2510C overlying drain region 2122. A second anneal is then performed to reduce the silicide sheet resistance. Typically, additional processing using conventional techniques are used to fabricate contacts to the gates and active regions of the transistors.

In the above-described manner, transistors having polycide gates and transistors having salicide gates can be fabricated on a single wafer using an efficient semiconductor process. The various embodiments of the structures and methods of this invention that are described above are illustrative only of the principles of this invention and are not intended to limit the scope of the invention to the particular embodiments described. For example, in view of this disclosure, those skilled in the art can define other transistor types, gate structures, silicides, refractory metals, dielectrics, and so forth, and use these alternative features to create a method, semiconductor device, or integrated circuit according to the principles of this invention. Thus, the invention is limited only by the following claims.

What is claimed is:

1. A method of forming a semiconductor device comprising the steps of:

forming a polysilicon layer having a first portion and a second portion;

depositing a metal silicide layer on the first portion of the polysilicon layer, but not on the second portion of the polysilicon layer, whereby the first portion of the polysilicon layer becomes a polycide layer; and depositing a metal layer over the second portion of the polysilicon layer.

2. The method of claim 1, further comprising the steps of:

etching the polycide layer to form one or more polycide gate electrodes; and covering the polycide gate electrodes.

3. The method of claim 1, further comprising the steps of:

exposing the second portion of the polysilicon layer;

etching the exposed second portion of the polysilicon layer to define polysilicon gate electrode regions and expose source and drain regions; and wherein the metal layer is deposited over the polysilicon gate electrode regions and the source and drain regions.

4. The method of claim 3, further comprising the step of causing the metal layer to react with the polysilicon gate electrode regions and the source/drain regions, thereby forming metal salicide regions.

5. The method of claim 1, further comprising the steps of:

forming a dielectric layer over the polysilicon layer, wherein the dielectric layer has a first portion overlying the first portion of the polysilicon layer and a second portion overlying the second portion of the polysilicon layer;

forming a photoresist mask over the second portion of the dielectric layer; and removing the first portion of the dielectric layer.

6. The method of claim 1, further comprising the step of forming a dielectric layer over the polycide layer.

7. The method of claim 1, further comprising the step of forming one or more gate oxide layers.

* * * * *